(12) United States Patent
Hajipetrou et al.

(10) Patent No.: US 11,292,087 B2
(45) Date of Patent: Apr. 5, 2022

(54) GLASS SEPARATING AND CUTTING SYSTEM FOR ELECTRONIC MOBILE DEVICE REPAIR

(71) Applicant: Mobile Advanced Technologies, LLC, Lewes, DE (US)

(72) Inventors: Georgios Christodouloy Hajipetrou, Pretoria (ZA); Hans Claussen, Berlin (DE); Charalampos Kalyvas, Athens (GR)

(73) Assignee: Mobile Advanced Technologies, LLC

( * ) Notice: Subject to any disclaimer, the term of this patent is extended or adjusted under 35 U.S.C. 154(b) by 0 days.

(21) Appl. No.: 17/013,481

(22) Filed: Sep. 4, 2020

(65) Prior Publication Data
US 2021/0069833 A1    Mar. 11, 2021

Related U.S. Application Data

(60) Provisional application No. 62/897,179, filed on Sep. 6, 2019.

(51) Int. Cl.
*B23K 26/38*        (2014.01)
*B23K 26/06*        (2014.01)
(Continued)

(52) U.S. Cl.
CPC .......... *B23K 26/38* (2013.01); *B23K 26/0643* (2013.01); *B23K 26/0665* (2013.01);
(Continued)

(58) Field of Classification Search
CPC .. B23K 26/703; B23K 26/082; B23K 26/083; B23K 26/0816; B23K 26/706; B23K 26/0643; B23K 26/127; B23K 26/38; B23K 26/402; B23K 26/0006; B23K 26/0665; B23K 26/123; B23K 26/352; B23K 37/006; B23K 2103/42; B23K 2103/54; B23K 2101/36; B23K 26/00–707; B23K 15/00–10; B23K 7/00–107; B23K 9/00–328; B23K 10/00–027; B23K 26/362; B23K 26/0622; B23K 26/146; B23K 31/10; B23K 26/70; B23K 26/702;
(Continued)

(56) References Cited

U.S. PATENT DOCUMENTS 4,739,162 A * 4/1988 Ortiz, Jr ............. B23K 26/0673
                                                  219/121.8
5,611,949 A * 3/1997 Snellman ........... B23K 26/0838
                                                  219/121.67

(Continued)

FOREIGN PATENT DOCUMENTS

CN         108705202     * 10/2018

*Primary Examiner* — Ibrahime A Abraham
*Assistant Examiner* — Gyounghyun Bae
(74) *Attorney, Agent, or Firm* — Thorpe North & Western

(57) ABSTRACT

A system for separating the front and back outer glass layer from the casing/body of electronic mobile devices and for cutting mobile device screen protector sheets by way of laser burning and cutting comprises a housing, such housing containing a laser; a mirror galvanometer; a safety chamber enclosure; a metal plate with internal glass sheet; a chamber with opening and closing lid, lid button and lid sensor; a control printed circuit board with processor; a power inlet; a power supply; and an on/off switch.

18 Claims, 16 Drawing Sheets

(51) Int. Cl.
  *B23K 26/08* (2014.01)
  *B23K 26/082* (2014.01)
  *B23K 26/12* (2014.01)
  *B23K 26/70* (2014.01)
  *B23K 37/00* (2006.01)
  *C03B 33/08* (2006.01)
  *G02B 26/08* (2006.01)
  *G06F 8/65* (2018.01)
  *H05K 7/20* (2006.01)
  *B23K 103/00* (2006.01)

(52) U.S. Cl.
  CPC .......... *B23K 26/082* (2015.10); *B23K 26/083* (2013.01); *B23K 26/127* (2013.01); *B23K 26/703* (2015.10); *B23K 26/706* (2015.10); *B23K 37/006* (2013.01); *C03B 33/082* (2013.01); *G02B 26/0816* (2013.01); *G06F 8/65* (2013.01); *H05K 7/2039* (2013.01); *H05K 7/20136* (2013.01); *B23K 2103/42* (2018.08); *B23K 2103/54* (2018.08)

(58) Field of Classification Search
  CPC .... B23K 26/36; B23K 26/0738; B23K 26/40; B23K 26/0613; B23K 26/0624; B23K 26/53; B23K 26/55; B23K 2103/50; B23K 26/064; G06F 8/65; C03B 33/074; C03B 33/082; C03B 33/0222; G02B 26/0816; H05K 7/20136; H05K 7/2039; B29C 65/16; G01C 19/66; G01C 19/72; H01S 3/10; H01S 3/06791; F01D 5/286; F05D 2230/13; C08J 5/18; C08J 7/047; Y10T 428/24355; Y10T 428/21; Y10T 428/24273; B32B 2250/02; B32B 2315/02; B32B 17/06; Y02P 40/57
  USPC .......... 65/160; 219/121.6–121.86; 428/64.1, 428/131, 141
  See application file for complete search history.

(56) References Cited

U.S. PATENT DOCUMENTS

| | | | | |
|---|---|---|---|---|
| 5,653,900 | A * | 8/1997 | Clement | B23K 26/0838 219/121.68 |
| 5,833,006 | A * | 11/1998 | McCabe | A62C 35/20 169/51 |
| 7,782,610 | B2 * | 8/2010 | Diebel | H05K 13/00 361/679.56 |
| 8,800,907 | B2 * | 8/2014 | Koenig | H02G 11/02 242/379 |
| D759,004 | S * | 6/2016 | Stevinson | D14/250 |
| 9,520,913 | B1 * | 12/2016 | Jones | H04M 1/15 |
| 9,564,571 | B2 * | 2/2017 | Cheng | H02J 7/0044 |
| 9,748,998 | B2 * | 8/2017 | Gronewoller | H04M 1/0258 |
| 10,429,886 | B2 * | 10/2019 | Feng | G06F 1/1635 |
| 10,579,108 | B2 * | 3/2020 | Dilaura | G06F 1/1686 |
| 10,742,789 | B2 * | 8/2020 | Ackerman | H04B 1/3888 |
| D915,387 | S * | 4/2021 | Markey | D14/251 |
| 2007/0175891 | A1 * | 8/2007 | Maeda | H05B 6/6417 219/720 |
| 2013/0129138 | A1 * | 5/2013 | Washington, Jr. | H04R 1/1033 381/384 |
| 2013/0314030 | A1 * | 11/2013 | Fathollahi | H02J 7/0045 320/107 |
| 2014/0314266 | A1 * | 10/2014 | Kroupa | A45C 13/002 381/384 |
| 2015/0158123 | A1 * | 6/2015 | Kyoto | B23K 26/36 219/121.73 |
| 2016/0173160 | A1 * | 6/2016 | Gronewoller | H04B 1/3883 455/575.8 |
| 2016/0276047 | A1 * | 9/2016 | Yamamoto | B23K 26/706 |
| 2016/0294201 | A1 * | 10/2016 | Avital | H04B 1/3883 |
| 2019/0030647 | A1 * | 1/2019 | Yeh | B23K 26/082 |

\* cited by examiner

GLASS SEPARATING AND CUTTING SYSTEM FOR ELECTRONIC MOBILE DEVICE REPAIR

RELATED APPLICATION

This application claims the benefit of U.S. Provisional Application No. 62/897,179, filed on Sep. 6, 2019, the content of which is incorporated herein by reference.

BACKGROUND

Mobile electronic devices such as (but not limited to) tablets, mobile phones, mobile smart phones and gaming devices have become increasingly popular. Most mobile electronic devices have front screen displays and/or back glass casings which crack and break fairly easily when the mobile electronic device is accidentally dropped by a user.

Current market screen displays are comprised of a front glass layer which is glued with a transparent adhesive to either a touch sensitive display or a liquid crystal display (LCD) or a touch sensitive organic light emitting diode display (OLED), or other type of display screen. In most cases when a screen display is cracked only the front glass layer has cracked and the underlying display still works perfectly. In the event that the screen display of an electronic mobile device is cracked, the user of such device has the unfortunate experience of having to replace the screen display with a new screen display complete with front glass and underlying display (LCD (liquid crystal display) or OLED (organic light emitting diode) or other), as it is extremely difficult, in a mobile repair store environment, to separate the broken front glass from the underlying display and in most cases also from the electronic mobile device casing, as the front glass and the underlying display are bonded together with a very strong adhesive. This is very costly for the owner of the electronic mobile device, as he/she has to pay for a complete new screen display, and in the event that the owner decides to replace the cracked screen display of his electronic mobile device with a non-original, less costly screen display the result is a reduction in the quality, performance and specifications of his/her electronic mobile device.

In the event that the back glass casing of the electronic mobile device is cracked, the owner will most likely have the unfortunate experience of having to pay the official service agent for a replacement electronic mobile device as it is extremely difficult to unstick the back glass casing from the electronic mobile device underlying casing and the official service agent prefers to replace such damaged electronic mobile device instead of repairing the electronic mobile device. In the event that the owner of the electronic mobile device can find a service agent who is willing to remove and replace the broken back glass casing, the cost is very high and also requires a few days of repair time, leaving the owner of the electronic mobile device without the use of his/her electronic mobile device for a couple of days.

Laser systems for separating the back glass of electronic mobile devices from the underlying casing are also known in the art. These laser systems operate by placing the electronic mobile device on a bottom plate with the laser located directly above the electronic mobile device, then burning the adhesive between the back glass and the underlying casing of the electronic mobile device with a laser beam and thereafter applying substantial physical labor and force with various tools to separate the back glass from the underlying casing. This process is not efficient, requires substantial labor from a trained experienced technician, requires a lot of time and has a high level of difficulty. This process is also extremely dangerous as the laser beam is directed downwards on the electronic mobile device in open air resulting in a potential risk of the laser beam injuring the technician or another person should he/she accidentally place a part of his/her hand or body in the way of the laser beam. There is also the risk of the laser beam damaging the technicians/persons eyes. Furthermore, once the laser burns the adhesive between the back glass and the underlying casing of the electronic mobile device, there is a potential risk that toxic fumes are released which can poison and cause harm to a person who inhales them. New models of electronic mobile devices are released regularly. This requires frequent settings and software upgrades to laser systems as each screen display is unique and requires different laser burning areas and settings. Frequent settings and software upgrades require on-site software upgrades and maybe even mechanical setting changes. If done regularly this is a costly, timely and difficult exercise, and if done incorrectly will result in repair failures. Also, if the frequent settings and software upgrades are not done regularly, the laser machines will be unable to perform repairs on new electronic mobile device models. Other difficulties encountered with the laser machines referred to above are that the laser machines do not have internet communication hardware and software allowing them to connect to a central server via the internet facilitating the sending and receiving of instructions and data to and from the laser machine and a central server, the laser machines cannot, on a remote real time basis, receive instructions, data and laser parameters (laser cutting and burning dimensions, laser strength) specific to a particular mobile device from a central server via the internet, the software and laser parameters of the laser machines cannot be updated remotely via the internet, there is no real time machine website control platform or app control platform and database whereby the owner of one or multiple machines can either remotely update one or more machine software and settings and/or remotely control the operation of one or more machines and/or remotely activate and de-activate one or more machines and/or have immediate remote access to real time or historical statistical information related to the repairs done by such machines, repairs per electronic mobile device model, repairs per technician, repairs per time period, repairs per location, repairs per grouped electronic mobile device models, technicians, time periods and locations, repair success rates, repair times, electronic mobile device models repaired, technician identity, defects of the machine, wrong machine settings, user identified machine defaults, consumables and parts required and being able to order such consumables and parts immediately via the machine website control platform or app control platform.

SUMMARY

A system is provided comprising a central laser machine incorporating internet data communication hardware and software and a laser chamber which is not visible nor accessible to the central laser machine user when the laser chamber is closed, molds which allow the laser beam to burn and/or cut only on the required areas of the electronic mobile device screen, back glass or casing or mobile device screen protector sheet (glass or plastic) housed therein and a central computer server hosting and operating a web-centric based and/or mobile app based software application which connects to the central laser machine via the internet. The system:
A. efficiently separates the cracked front glass layer of an electronic mobile device screen from the underlying display (LCD or OLED or other);
B. efficiently separates the cracked front glass layer of an electronic device screen from the frame and/or underlying casing of the electronic mobile device;
C. ensures the safety of the technician, nearby people and the mobile repair store environment whilst the machine and the laser are in operation and also when the machine and laser are not in operation;
D. performs remote central laser machine software and setting updates so as to accommodate new electronic mobile device models as and when the new electronic mobile device models come into the market, to rectify machine operation defects, to improve machine functionality and also to add additional central laser machine functionality;
E. performs real time remote sending and receiving of instructions, laser parameters (laser cutting and burning dimensions, laser strength, laser time) and data specific to a particular mobile device model to and from the central laser machine and the central server via the internet;
F. performs real time sending and receiving of data between the central laser machine and the central server via the internet facilitating updates to the software of the central laser machine so as to accommodate the efficient and correct laser burning and cutting of new electronic mobile device models, to rectify operating defects of the central laser machine, to improve the central laser machine efficiency and functionality as well as to add additional central laser machine functionality;
G. performs remote sending and receiving of instructions, laser parameters (laser cutting and burning dimensions, laser strength, laser time) and data specific to a particular mobile device model to and from the central laser machine and the central server via the internet so as to facilitate the cutting by the central laser machine of a mobile device screen protector sheet (glass or plastic) to the exact required dimensions of the particular mobile device model; and
H. includes a real time web-centric or app based central laser machine control software platform and database allowing remote central laser machine control as well as remote access to real time and historic central laser machine operations, and repair/refurbish related data.

In one aspect of the technology, a system for separating the front screen glass and/or back glass from the casing/body of electronic mobile devices (such as but not limited to) mobile phones, smartphone, tablets, gaming devices and PDAs (personal digital assistants) by way of laser burning and/or cutting and also for cutting mobile device screen protector sheets (glass and/or plastic) to specific mobile device model dimensions by way of laser burning and/or cutting is disclosed.

The system comprises a central laser machine which incorporates internet data communication hardware and software and a laser chamber, molds with varying dimensions which match the dimensions of various electronic mobile devices and mobile device screen protector sheets and a central computer server hosting and operating a web-centric and/or a mobile app based software application which connects to, communicates with, exchanges data, updates software and operates the central laser machine via the Internet.

In one aspect, the central laser machine is comprised of 6 panels which are held together by 4 internal metal columns and screws forming the central laser machine housing. In one aspect the central laser machine housing contains one or more of the following components and features. In one aspect the central laser machine housing contains a mirror galvanometer and a laser which beams the laser beam in an upwards direction and is used for burning the adhesive between the front glass and/or back glass and the underlying body/casing of the electronic mobile device so as to unstick and separate them and which is also used to burn and cut mobile device screen protector sheets (glass or plastic) to specific mobile device model dimensions. In one aspect the central laser machine housing contains a safety chamber/enclosure within which the laser beams are channeled to ensure that the laser operates safely only within the dimensions of the chamber.

In one aspect the central laser machine housing contains one or more of the following components and features. In one aspect the central laser machine housing contains a metal perimeter steel plate with internal glass sheet which is located on the top end of the safety chamber/enclosure thus sealing the safety chamber/enclosure and ensuring that no dust or items fall into the safety chamber/enclosure and onto the mirror galvanometer and laser components. In one aspect the aforesaid metal perimeter steel plate with internal glass sheet has an adjustable base on top of the internal glass sheet which is attached to the metal perimeter plate via 4 screws which when turned results in the increase or decrease of the height of the adjustable base and serves the purpose of adjusting the focal point of the laser beam which is beamed from the laser and directed by the mirror galvanometer through the safety chamber/enclosure and through the internal glass sheet. In one aspect the central laser machine housing also contains a lid which opens and closes utilizing hinges and an open close button and which is located on the top housing panel forming a chamber on top of the internal glass sheet so that the molds which house the electronic mobile device being repaired or the mobile device screen protector sheet to be cut can be placed on the adjustable base and the lid is then closed thus ensuring safe laser operation and keeping the laser beams strictly within the aforesaid chamber and focused on lasering the molds with electronic mobile device or mobile device screen protector contained therein or whatever other item has been placed in the chamber without the use of a mold (such as but without limitation, mobile device screen protector, mobile device, mobile device screen).

In one aspect the central laser machine housing also contains a sensor mounted on the base of the lid which ensures that the laser cannot operate unless the lid is closed. In one aspect the central laser machine housing contains a control printed circuit board with processor and operating system software which is connected to the mirror galvanometer, the laser, the lid sensor, the power supply inlet, the central laser machine button and communications printed circuit board as described below and which is capable of operating and controlling the central laser machine. In one aspect, the central laser machine housing contains a power supply inlet on the back panel, which is connected to the control printed circuit board and the internal power supply unit which powers the laser.

The system may also contain one or more of the following features. In one aspect the central laser machine housing may also contain a communications printed circuit board with processor and operating software system for enabling two way data communication between the control printed circuit board and the central computer server via the Internet, a Wi-Fi antennae with WPS (Wi-Fi Protected Setup) switch for connecting the communications printed circuit board with a wireless Internet network, an Ethernet inlet port for connecting the communications printed circuit board with a wired Internet network, a USB (Universal Serial Bus) or other communications port for on-site machine software upgrading and machine diagnosis and a screen display for on-site controlling and operating the central laser machine and for displaying functionality and operational information of the central laser machine.

In one aspect of the technology, molds designed to conform with the dimensions of various models of electronic mobile devices and mobile device screen protector sheets are disclosed. In one aspect, the molds all contain a central base unit with a chamber with indentation which is compatible with the dimensions of one or more models of electronic mobile devices and/or mobile device screen protector sheets which when placed inside the indentation chamber fit within the central base unit of the mold. The indentation dimensions vary based on the dimensions of the electronic mobile devices and/or mobile device screen protector sheets that the mold has been designed for. In one aspect the bottom side of the central base unit of the mold has a specific design with specific openings, whereby a laser beam directed to the underside of the mold can only burn and/or cut the areas of the item (the outer glass, adhesive and underlying casing of the electronic mobile device or a mobile device screen protector sheet or mobile electronic device or mobile device part) housed in the mold which are exposed to the laser. In one aspect, the bottom side of the base of the mold is closed off by a glass layer which allows the laser beam to pass through the glass layer and on to the exposed part of the item housed in the mold. In one aspect, the mold contains a top sliding or magnetic cover which when put in place seals off the indentation chamber in which the electronic mobile device and/or mobile device screen protector sheet is housed thus ensuring that toxic fumes which are created when the laser beam burns and/or cuts the item housed in the mold are trapped and allowed to settle into dust prior to such item being removed from the mold indentation chamber thus preventing the toxic fume poisoning people who are located nearby.

In one aspect the system may also contain a central computer server hosting and operating a web-centric and/or a mobile app software application used for remotely operating the central laser machine unit via the Internet and/or remotely updating the central laser machine software and settings via the Internet and also for providing real time and historical central laser machine operating data to the user of the system whereby the owner of one or multiple central laser machines can either remotely update one or more central laser machine software and settings and/or remotely control the operation of one or more central laser machines and/or remotely activate and de-activate one or more central laser machines and/or have immediate remote access to real time or historical statistical information related to the repairs done by such machines, repairs per electronic mobile device model, repairs per technician, repairs per time period, repairs per location, repairs per grouped electronic mobile device models, technicians, time periods and locations, repair success rates, repair times, electronic mobile device models repaired, technician identity, defects of the machine, wrong machine settings, user identified machine defaults, consumables and parts required and being able to order such consumables and parts immediately via the web-centric and/or a mobile app software application.

DETAILED DESCRIPTION

Figure 1A:
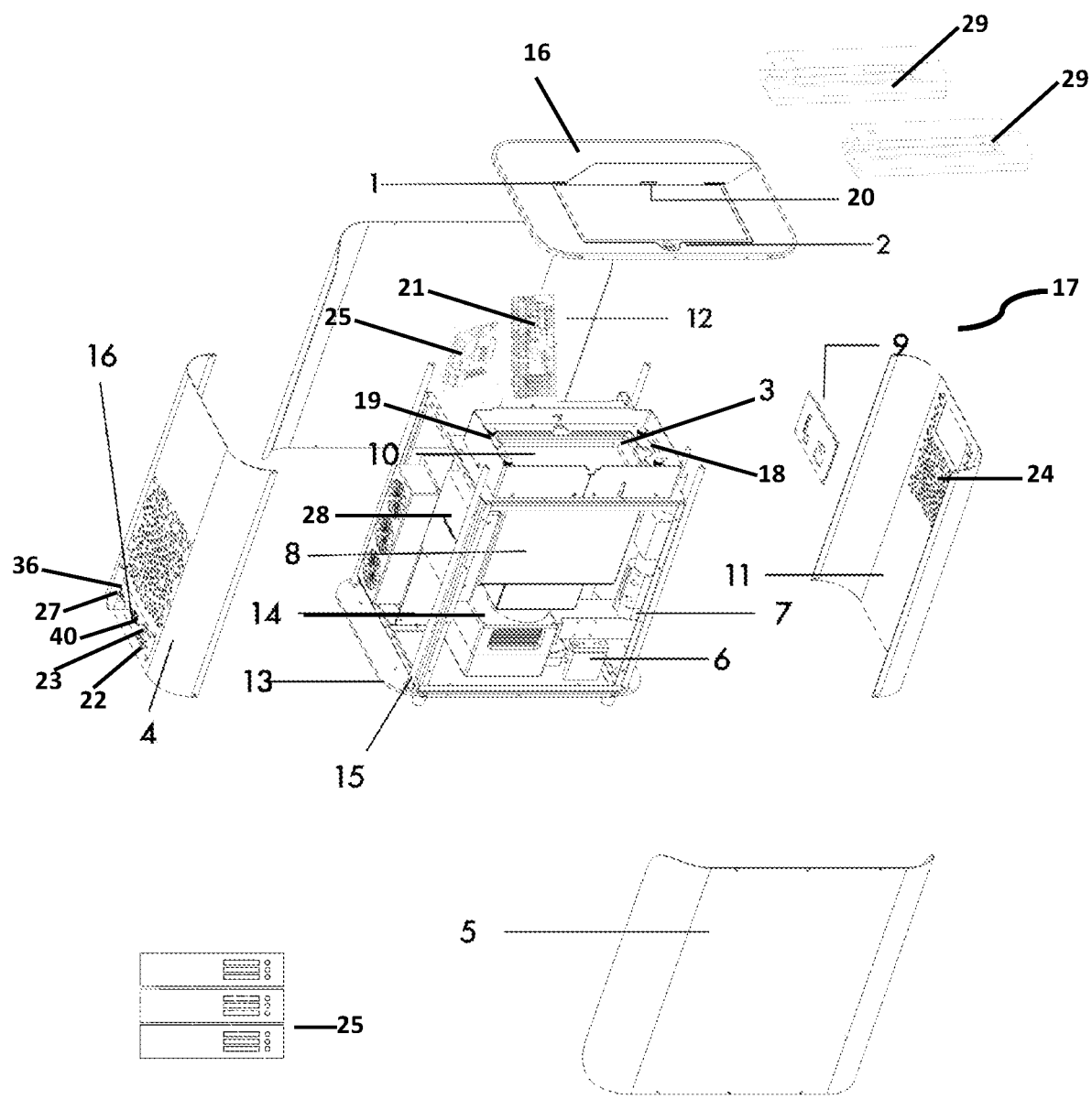
FIG. 1A is a view of the system with one or more aspects of the technology.

The technology may be best understood by reference to the following description taken in conjunction with the accompanying representations.

Turning now to FIGS. 1A through 1I, various views of the central laser machine 17 in accordance with one or more aspects of the present technology are shown. A back housing panel 4, a front housing panel 11, a bottom housing panel 13, a left side panel 5, a right side panel 12 and a top housing panel 16 are shown. The four corners of the top housing panel 16 are screwed onto the top end of four steel columns 15, whilst the bottom end of the 4 steel columns 15 is screwed onto the four corners of the bottom housing panel 13. The front housing panel 11, the back housing panel 4, the side left panel 5, the side right panel 12 are clipped or screwed onto the four steel columns 15 resulting in the formation of the housing of the central laser machine.

Figure 1B:
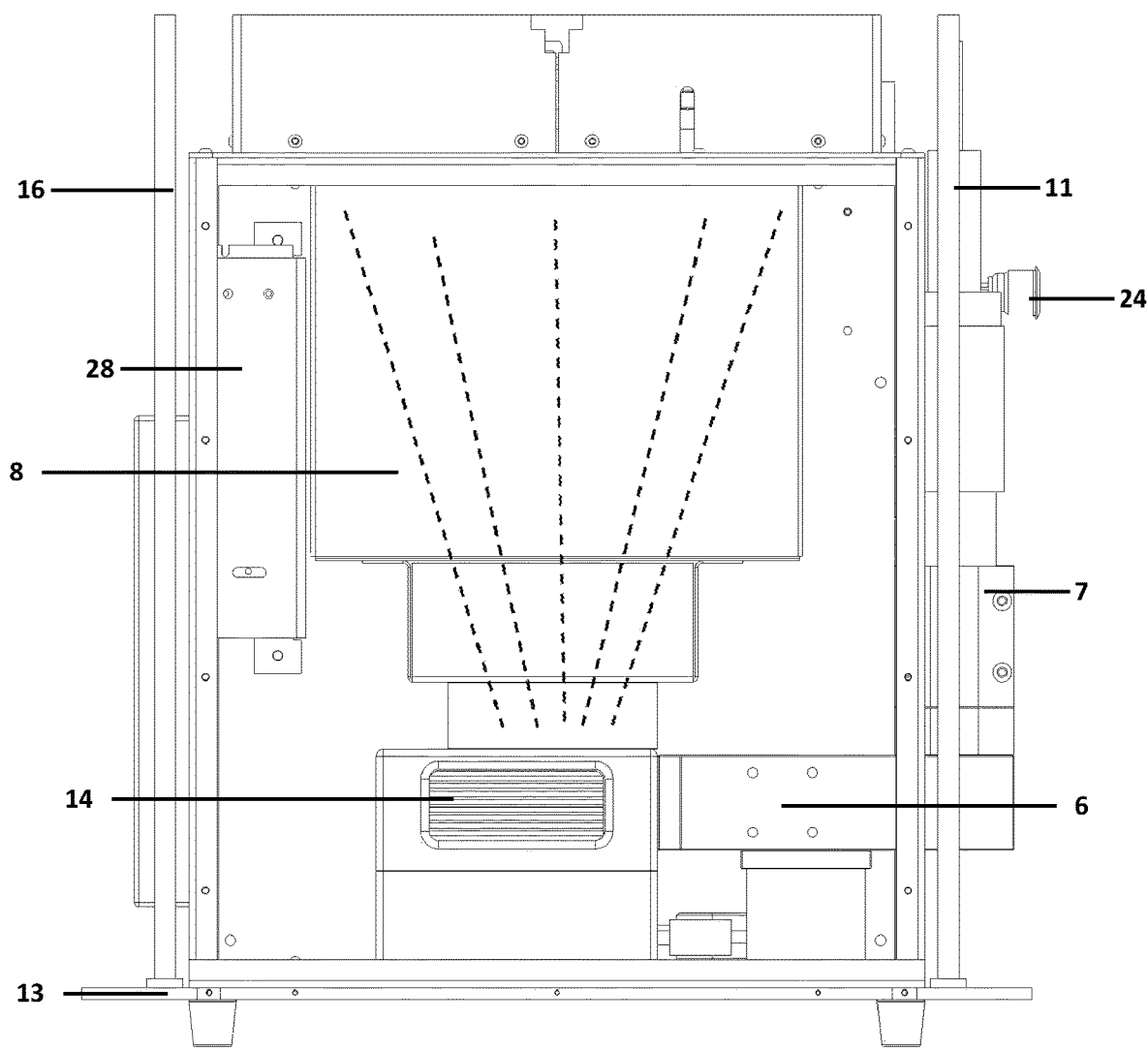
FIG. 1B is a side view of the central laser machine showing specifically the laser, the laser power supply, the mirror galvanometer, the safety chamber enclosure, the metal perimeter steel plate, the central laser machine button, the bottom housing panel, the base, the front housing panel, the back housing panel and the direction and location of the laser beams emanated from the laser and directed by the mirror galvanometer.
Figure 1C:
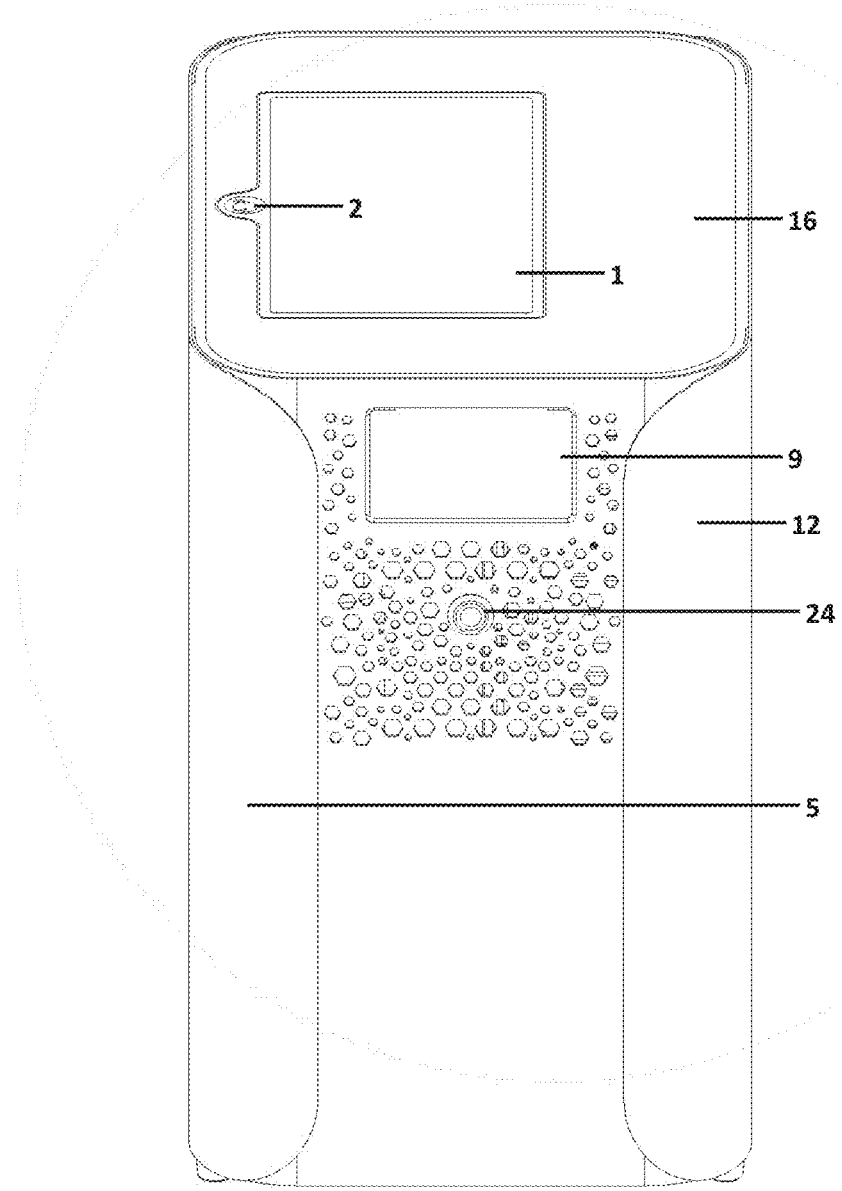
FIG. 1C is a front view of the central laser machine specifically showing the front housing panel, left housing panel, right housing panel, the top housing panel, the opening closing lid in a closed position, the central laser machine button and the screen display.
Figure 1D:
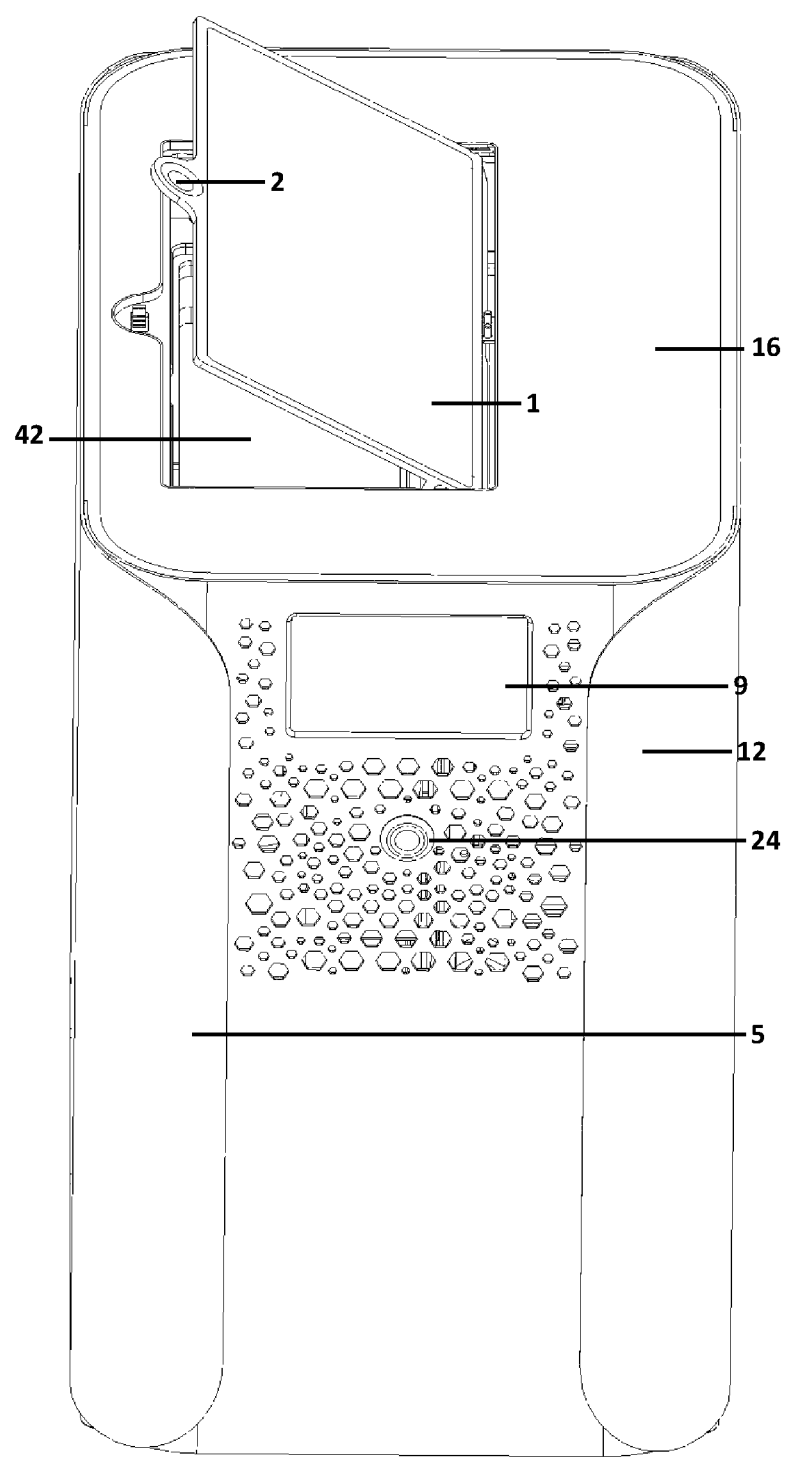
FIG. 1D is a front view of the central laser machine specifically showing how the lid opens and closes.
Figure 1E:
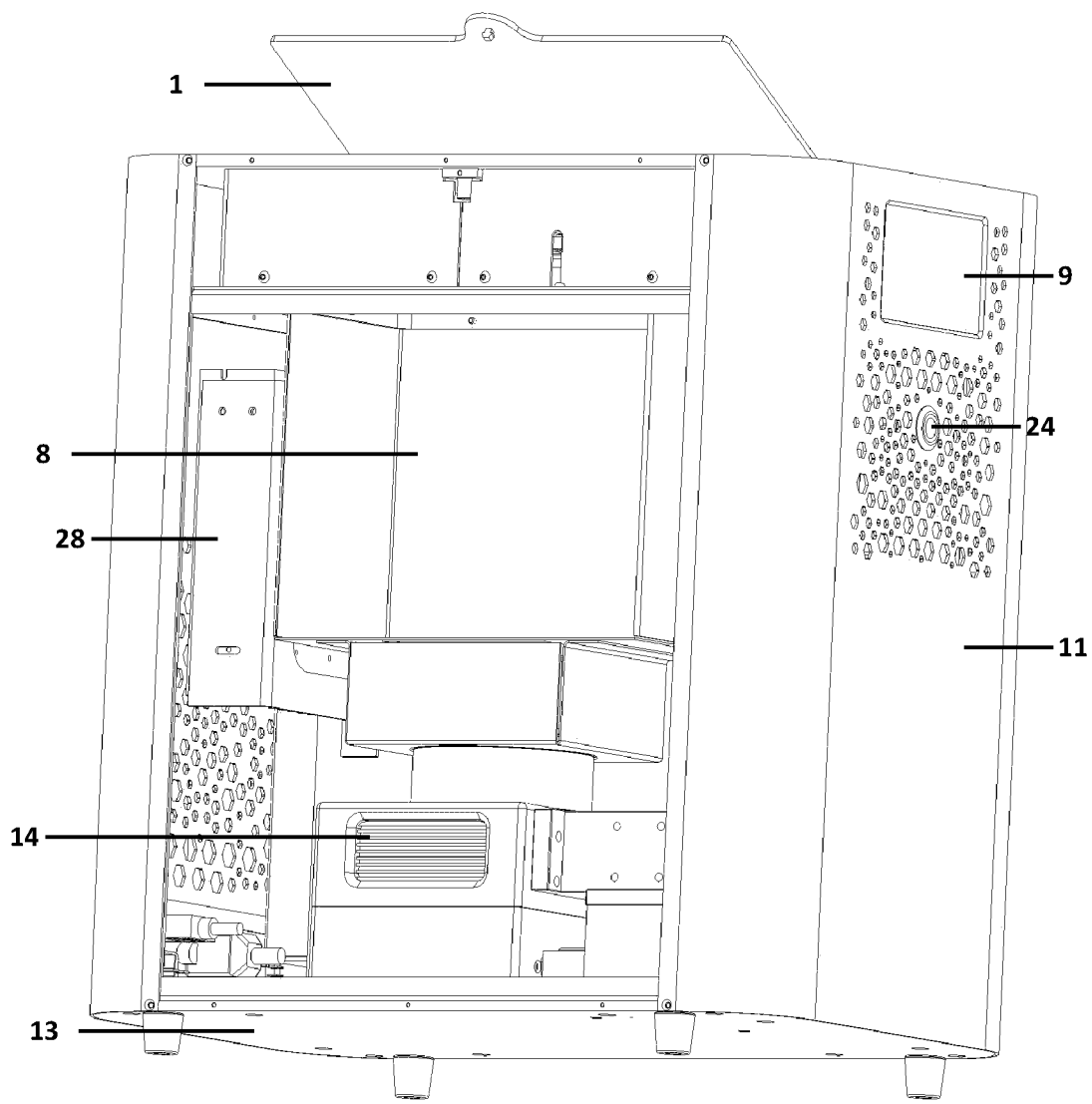
FIG. 1E is a side view of the central laser machine specifically showing the front housing panel, the central laser machine button, the screen display, the bottom housing panel, the back housing panel, the mirror galvanometer, the base, the laser, the safety chamber enclosure, the metal perimeter steel plate and the opening closing lid.
Figure 1F:
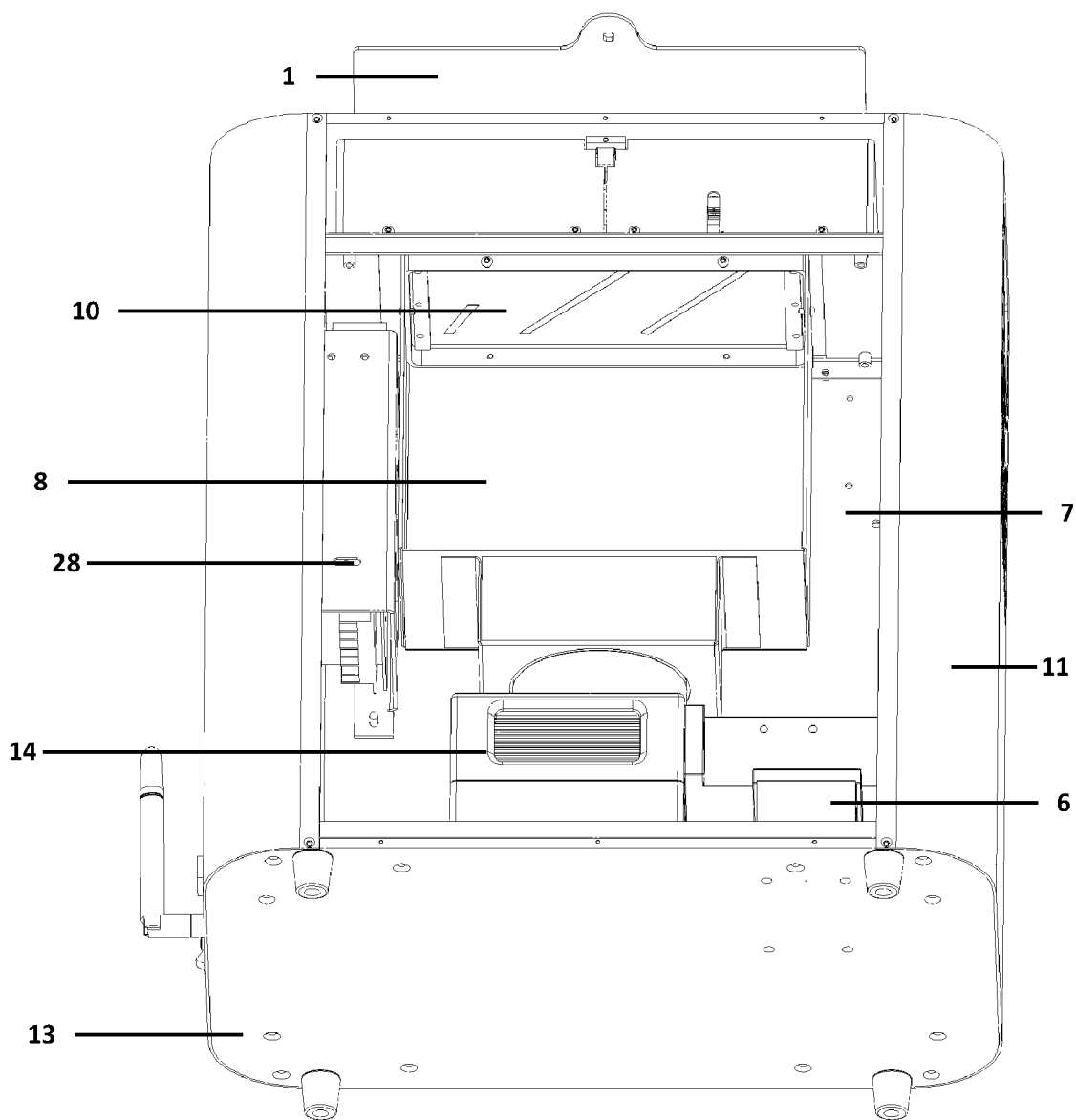
FIG. 1F is a bottom side view of the central laser machine specifically showing the bottom housing panel, the front housing panel, the back housing panel, the Wi-Fi antennae, the mirror galvanometer, the base, the laser, the safety chamber enclosure, the internal fitted glass sheet, the metal perimeter steel plate, the laser power supply and the opening closing lid.
Figure 1G:
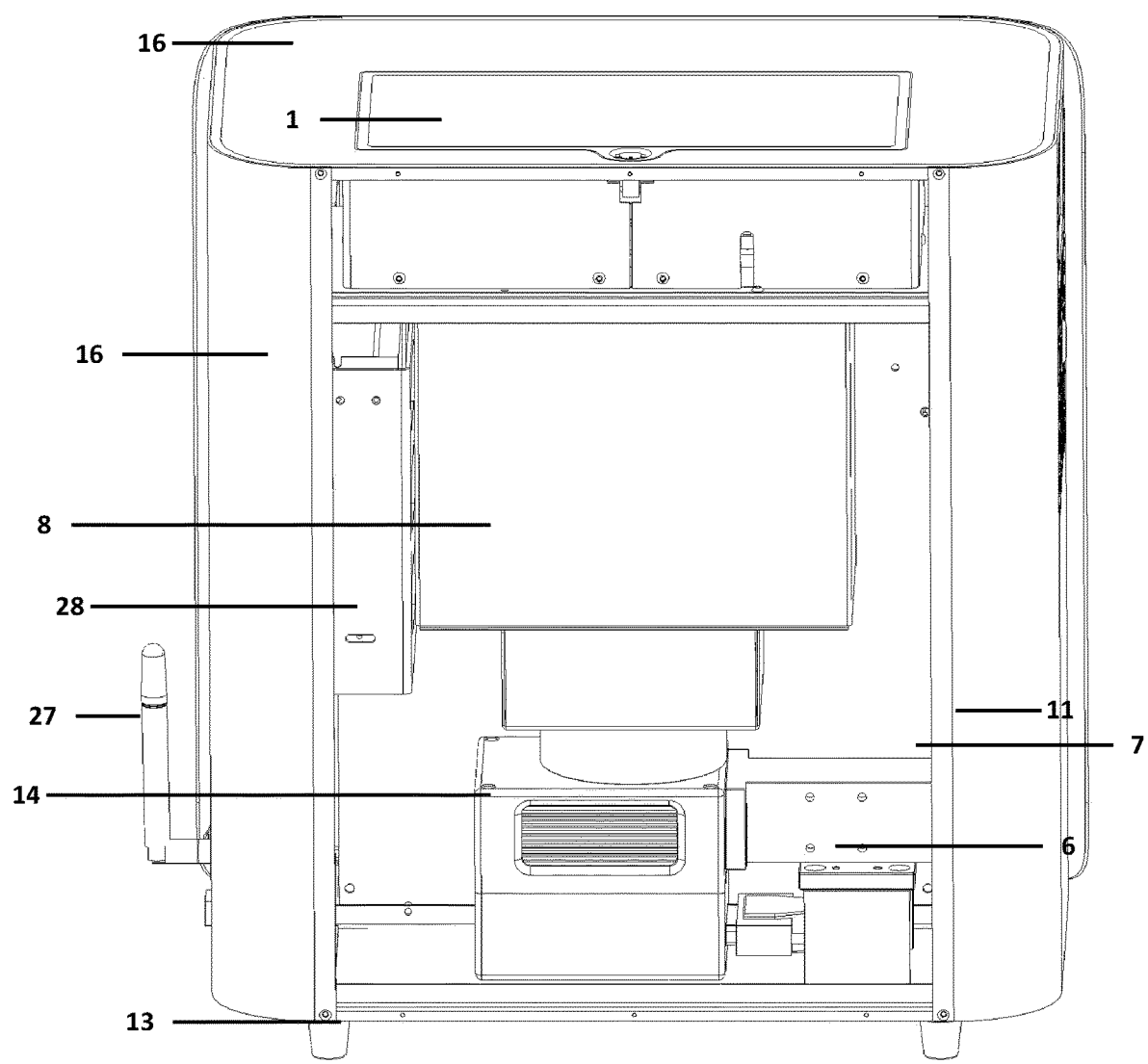
FIG. 1G is a side view of the central laser machine specifically showing the bottom housing panel, the front housing panel, the back housing panel, the Wi-Fi antennae, the mirror galvanometer, the base, the laser, the safety chamber enclosure, the metal perimeter steel plate, the top housing panel, the laser power supply and the opening closing lid in a closed position.
Figure 1H:
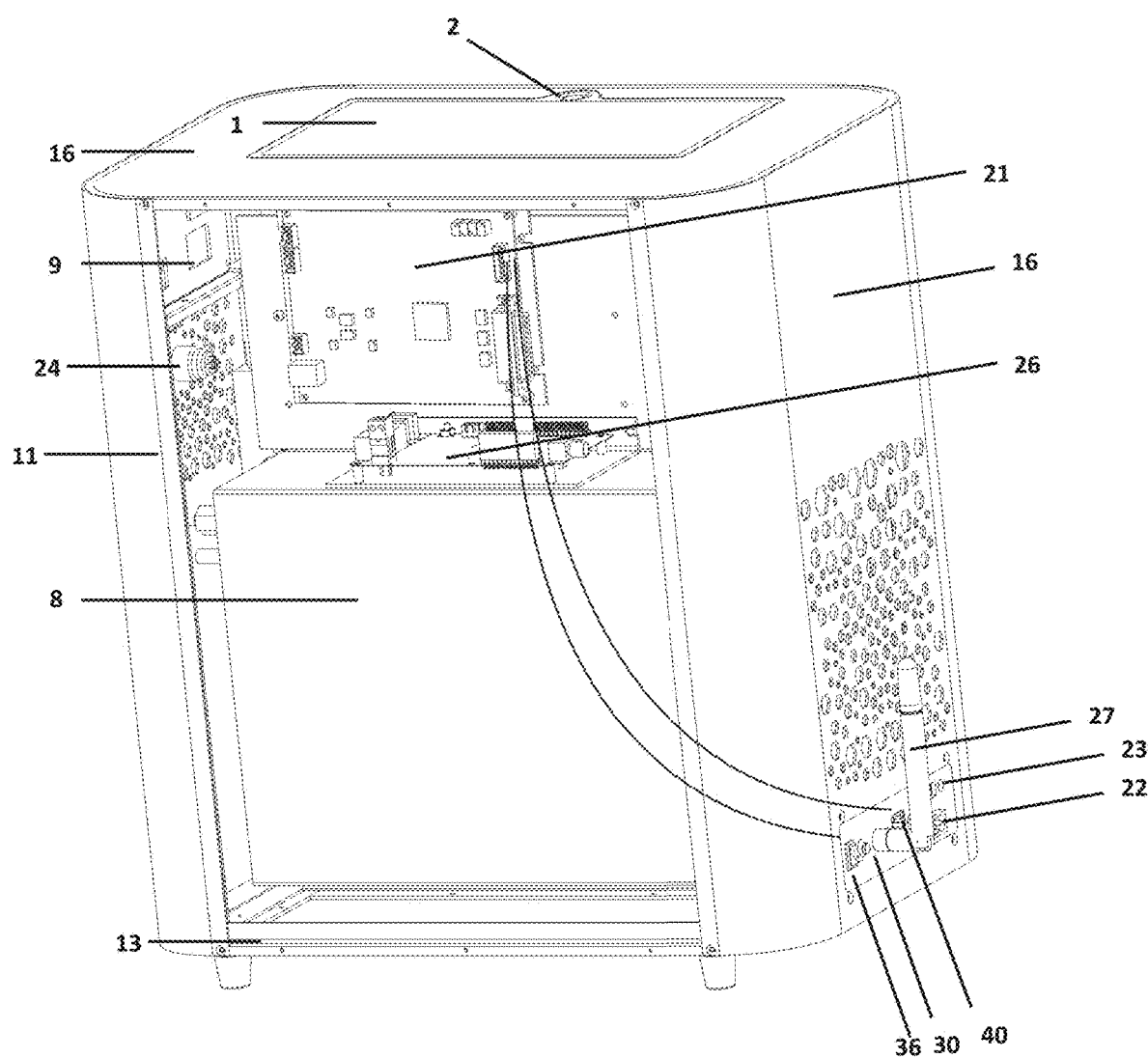
FIG. 1H is a side view of the central laser machine specifically showing the control printed circuit board with processor and operating system software, the communications printed circuit board with processor, the bottom housing panel, the top housing panel, the opening closing lid, the front panel housing, the screen display, the central laser machine button, the back housing panel, the on/off switch, the Wi-Fi antennae, the WPS switch, the Ethernet inlet port, the USB inlet port and the power inlet port.
Figure 1I:
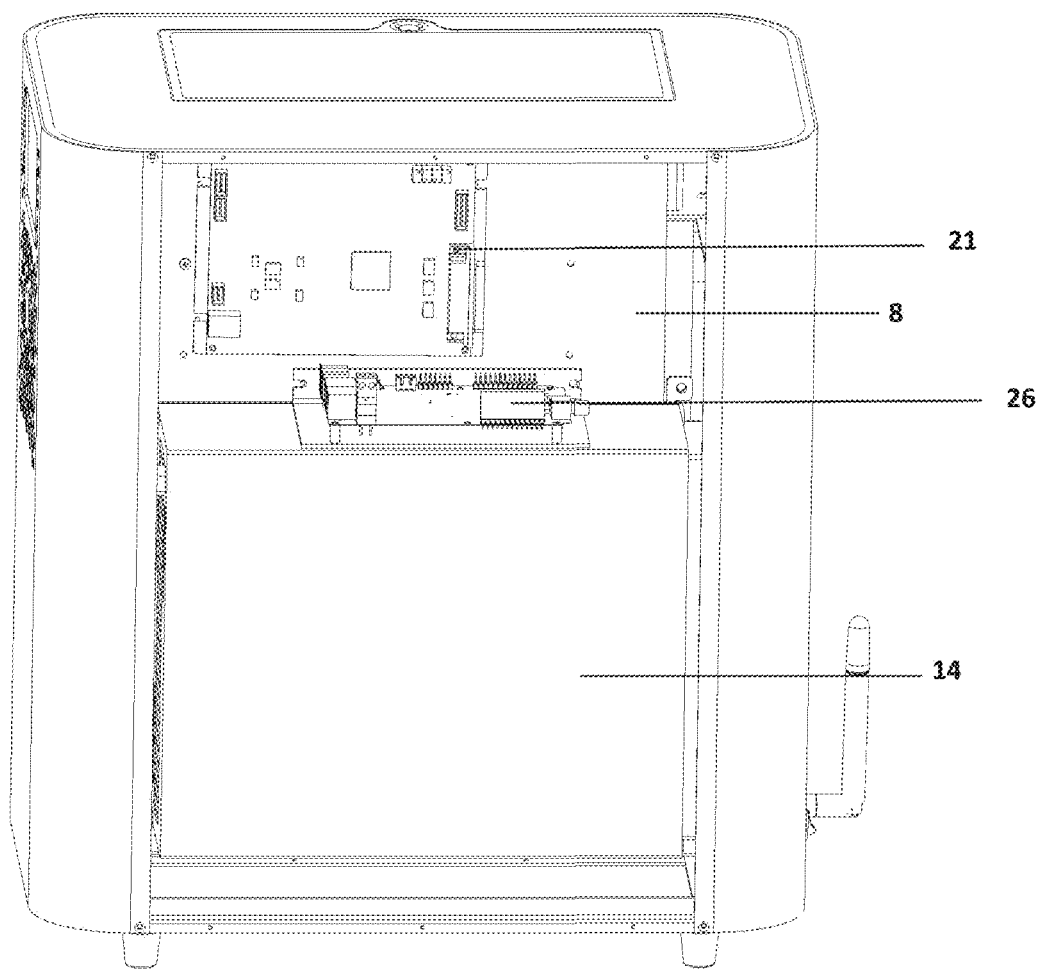
FIG. 1I is a side view of the central laser machine specifically showing the control printed circuit board with processor and operating system software, the communications printed circuit board with processor, the bottom housing panel, the top housing panel, the opening closing lid, the front panel housing, the screen display, the back housing panel, the on/off switch and the Wi-Fi antennae.

Within the housing of the central laser machine 17, a base 6 is also shown which is screwed to the bottom housing panel 13 and is utilized as a base mounting for the laser 7. Attached upside down to the bottom end of the safety chamber enclosure 8, a mirror galvanometer 14 is also shown. The mirror galvanometer 14 is connected to the laser 7 by fiber optic cable and is used to direct the laser beam produced by the laser 7. The exit point of the mirror galvanometer 14 is connected at the bottom end of the safety chamber enclosure 8, so that the laser beams produced and emanated by the laser 7 and directed by the mirror galvanometer 14 are directed in an upwards direction as shown in FIG. 1B and are contained within the safety chamber enclosure 8 for safety purposes.

A metal perimeter steel plate 3 with internal fitted glass sheet 10 is also shown. The metal perimeter steel plate 3 with internal fitted quartz glass sheet 10 is attached on the top end of the safety chamber enclosure 8 and serves the purpose of enclosing the safety chamber enclosure 8 so that no dust or items fall into the safety chamber enclosure 8 and onto the laser components. Furthermore the internal fitted glass sheet 10 serves the purpose of maintaining the safety chamber enclosure 8 sealed whilst still allowing the laser beams produced and emanated from the laser 7 and directed by the mirror galvanometer 14 to pass within the safety chamber enclosure 8 through the internal fitted glass sheet 10 and onto the mold housing an electronic mobile device 33 or mobile device screen protector (or any other item) or electronic mobile device part placed above the internal fitted glass sheet 10 or onto whatever item has been placed above the internal fitted glass sheet 10.

An adjustable perimeter base 18 is also shown. The adjustable perimeter base 18 is attached to the metal perimeter steel plate 3 via four screws 19 which when turned result in the increase or decrease of the height of the adjustable perimeter base 18 and serves the purpose of adjusting the focal point of the laser which is beamed from the laser 7 and directed by the mirror galvanometer 14 through the safety chamber enclosure 8 and through the internal fitted glass sheet 10.

An opening and closing lid 1 is also shown. The lid 1 is located on the top housing panel 16 and forms a chamber 42 (see FIG. 1D) on top of the internal fitted glass sheet 10 so that the laser mold 29 which houses the electronic mobile device 33 being repaired or the mobile device screen protector to be cut can be placed on the adjustable perimeter base 18 and the lid 1 is then closed thus ensuring safe laser operation and keeping the laser beams strictly within the aforesaid chamber and focused on burning and/or cutting the electronic mobile device 33 or the mobile device screen protector sheet or any other item placed within the laser mold 29 or on the adjustable perimeter base 18. A sensor mounted on the base of the lid 20 is also shown. The sensor ensures that the laser cannot operate unless the lid 1 is closed. An open button 2 is also shown. The open button 2 is pressed so that the lid 1 is released and is able to open in an upward motion. A power supply 28 is also shown. The power supply 28 is connected to the power inlet port 22 and provides power to the laser 7.

A control PCB (printed circuit board) 21 (with built in processor and operating system software not shown) is shown. The control PCB 21 is connected via electronic copper cable to the LCD screen 9, the mirror galvanometer 14, the laser 7, the lid sensor 20, the power supply inlet 22, the USB inlet 23 and the central laser machine button 24 and is used for controlling the operation and functions of these components and the overall functionality and operations of the central laser machine 17.

A communications printed circuit board 26 (with built in processor and operating system software not shown) is also shown. The communications printed circuit board 26 has a built in processor and operating system software and is used as a bridge to provide an Internet two-way data and command communication between the control PCB 21 and the central computer server 25 which hosts and operates a web-centric and/or a mobile app software application which remotely operates the central laser machine 17 via the Internet, sends real time laser burning, cutting, dimensions, time and operating instructions to the central laser machine 17 specific to the mobile device model being repaired or the mobile device screen protector being cut, remotely updates the central laser machine 17 software and settings via the Internet, provides real time and historical central laser machine 17 operating data to the user of the system and also empowers the owner of one or multiple central laser machines 17 to remotely update one or more central laser machine 17 software and settings and/or remotely control the operation of one or more central laser machines 17 and/or remotely activate and de-activate one or more central laser machines 17 and/or have immediate remote access to real time or historical statistical information related to the repairs done by such machines, repairs per electronic mobile device model, repairs per technician, repairs per time period, repairs per location, repairs per grouped electronic mobile device models, technicians, time periods and locations, repair success rates, repair times, electronic mobile device models repaired, technician identity, defects of the central laser machine 17, wrong central laser machine 17 settings, user identified central laser machine 17 defects, consumables and parts required and being able to order such consumables and parts immediately via the web-centric and/or a mobile app software application.

A Wi-Fi antennae 27 with WPS button 30, an on/off power switch 36, an Ethernet inlet port 40, a USB inlet port 23 and a power supply inlet port 22 is shown. The Wi-Fi antenna 27 with WPS button 30 is used for connecting the communications printed circuit board 26 with a wireless Internet network, the on/off power switch 36 is used to power on and power off the machine unit 17, the Ethernet inlet port 40 is used for connecting the communications printed circuit board 26 with a wired Internet network, the USB inlet port 23 is used for providing access to the operating software system of the control printed circuit board 21 from an external computer and also for updating the software on the control printed circuit board 21, the power inlet port 22 is used for connecting power to the control printed circuit board 21 and the power supply 28.

Figure 2A:
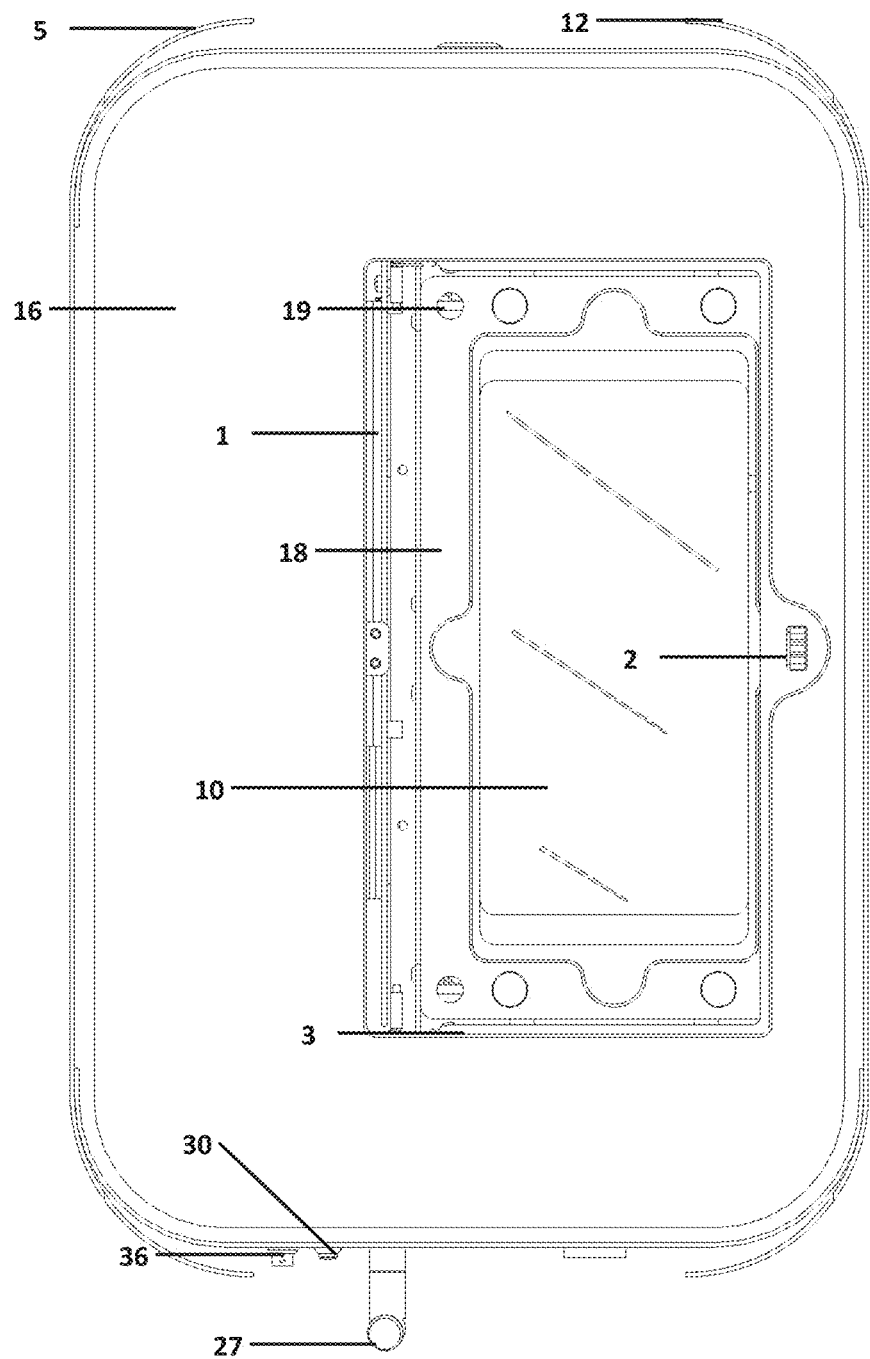
FIG. 2A is a top view of the central laser machine specifically showing the top housing panel, the opening closing lid, the internal fitted glass sheet, the metal perimeter steel plate, the adjustable perimeter base with 4 height adjustment screws, the Wi-Fi antennae, the on/off switch, the WPS button, the front housing panel, the back housing panel, the left housing panel and the right housing panel.
Figure 2B:
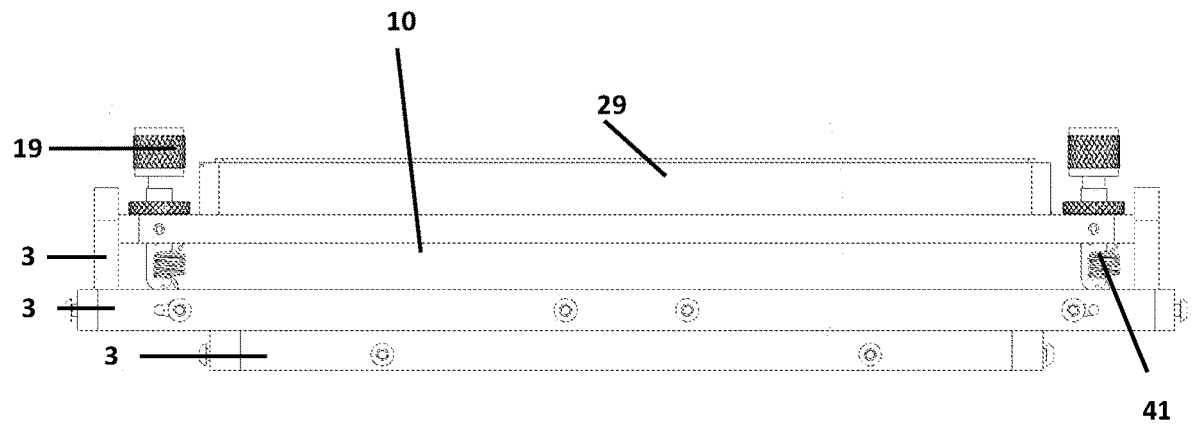
FIG. 2B is a side view specifically showing the metal perimeter steel plate, the adjustable base on top of the internal glass sheet attached to the metal perimeter plate via 4 screws with springs which keep an upward force to the adjustable base and the laser mold placed on the adjustable base.
Figure 2C:
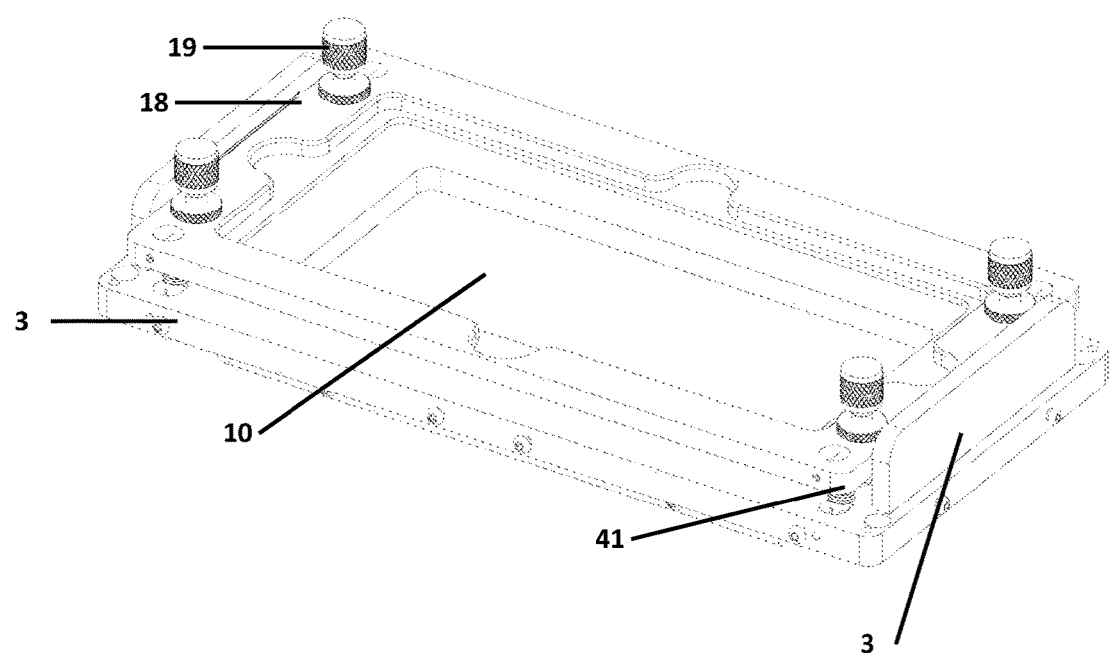
FIG. 2C is a top view specifically showing the metal perimeter steel plate, the internal glass sheet, the adjustable base attached to the metal perimeter steel plate via 4 screws and springs which keep an upward force to the adjustable base.

Turning now to FIG. 2A the metal perimeter steel plate 3, the internal fitted glass sheet 10, the adjustable perimeter base 18 and lid 1 shown in FIGS. 1A, 1B, 1D, 1E, and 1F are also shown. FIG. 2A specifically shows a top view of how the internal fitted glass sheet 10 is placed within the perimeter of the metal perimeter steel plate 3, the location of the lid 19 which opens in an upward direction and how the adjustable perimeter base 18 sits above the internal fitted glass sheet 10.

Turning now to FIG. 2B-2E the metal perimeter steel plate 3, the internal fitted glass sheet 10, the adjustable perimeter base 18, the screws 19 and the base springs 41 shown in FIGS. 1A, 1B, 1D, 1E, and 1F are also shown. The screws 19 serve the purpose of attaching the adjustable perimeter base 18 on to the metal perimeter base steel plate 3 as well as for increasing or decreasing the height of the adjustable perimeter base so as to change the focal point of the laser beams produced by the laser 7 and directed by the mirror galvanometer 14. The base springs 41 are used to provide an upwards force to the adjustable perimeter base 18.

Figure 2D:
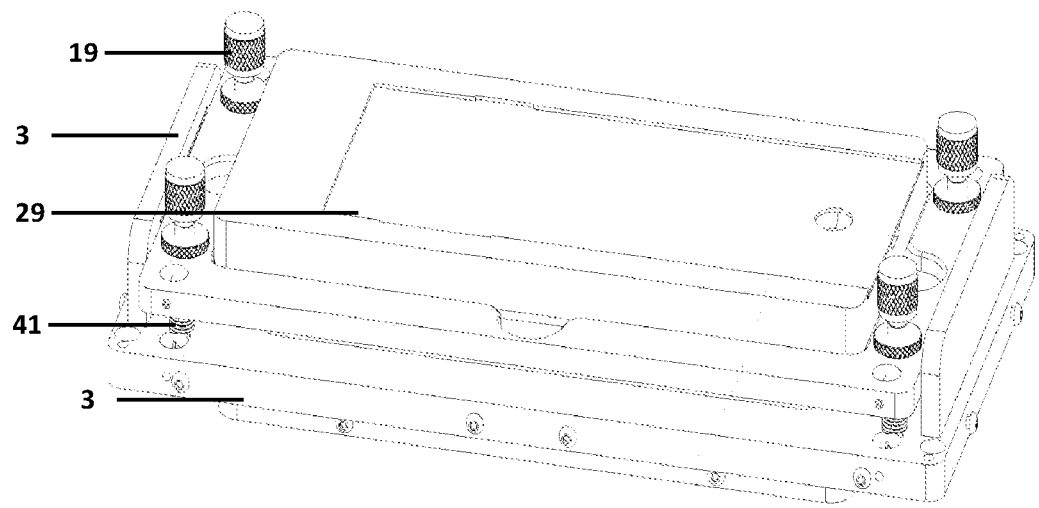
FIG. 2D is a top view specifically showing the metal perimeter steel plate, the adjustable base attached to the metal perimeter steel plate via 4 screws and springs which keep an upward force to the adjustable base and the laser mold placed on top of the adjustable base.
Figure 2E:
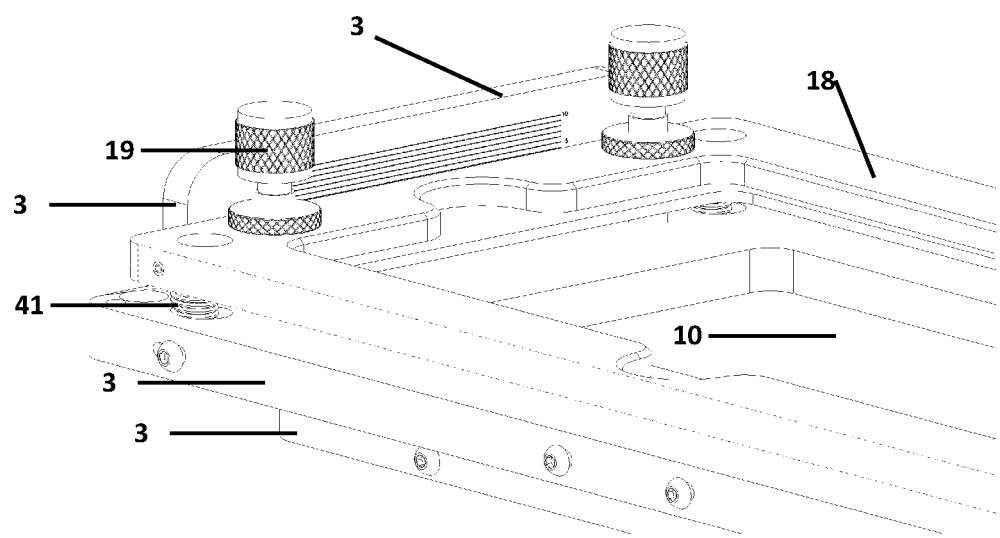
FIG. 2E is a side view specifically showing the metal perimeter steel plate, the adjustable base on top of the internal glass sheet and how the height of the adjustable base is increased or decreased by turning the screws which connect the adjustable base to the metal perimeter steel plate.

Turning now to FIG. 2D the metal perimeter steel plate 3, the internal fitted glass sheet 10, the adjustable perimeter base 18, the screws 19 and the base springs 41 shown in FIGS. 1A, 1B, 1D, 1E, and 1F are shown. The laser mold 29 is also shown. The adjustable perimeter base 18 is used as a base in which the mold 29 is placed so that the laser beams emanating from the laser 7 and directed by the mirror galvanometer 14 pass through the safety chamber enclosure 8, through the internal fitted glass sheet 10 and onto the bottom end of the mold 29.

Figure 3A:
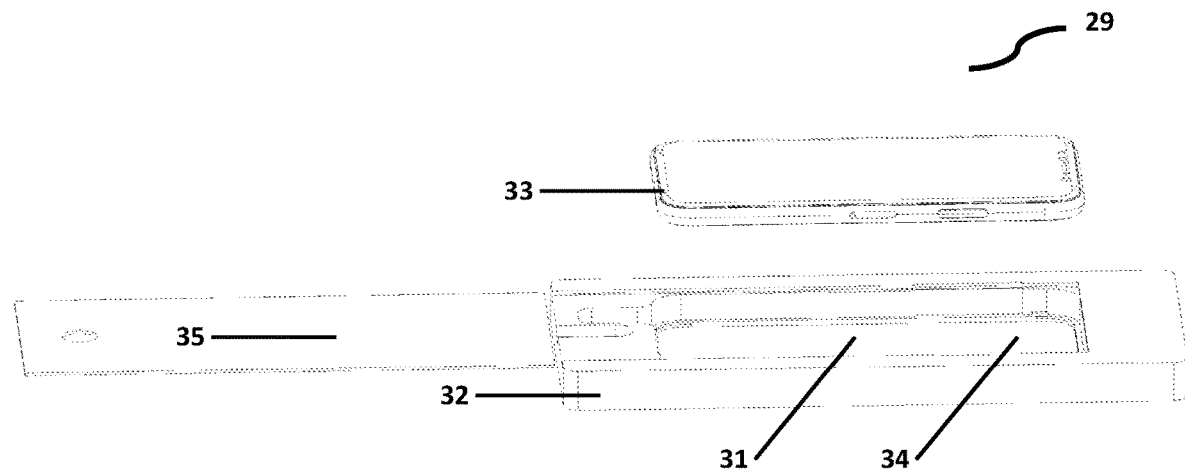
FIG. 3A is a side view of the laser mold showing the central base unit, the indentation chamber, the top slide cover as well as an electronic mobile device which fits into the indentation chamber.
Figure 3B:
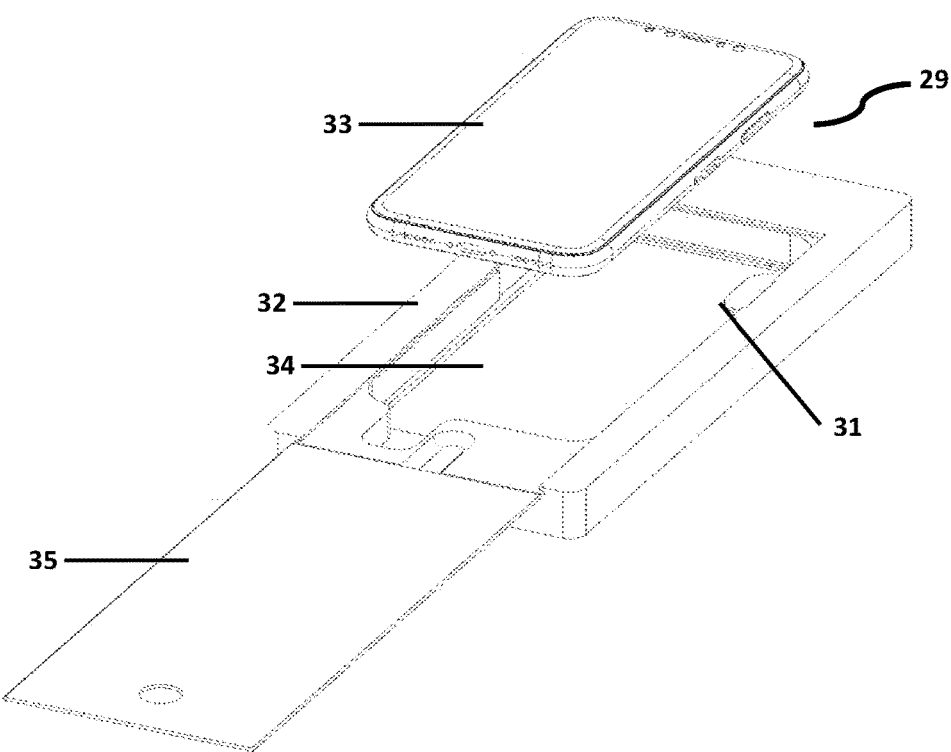
FIG. 3B is a top view of the mold showing the central base unit, the indentation chamber, the top slide cover, the bottom side of the central base unit with specific design with specific openings, the glass layer on the bottom side of the central base unit as well as an electronic mobile device which fits into the indentation chamber.
Figure 3C:
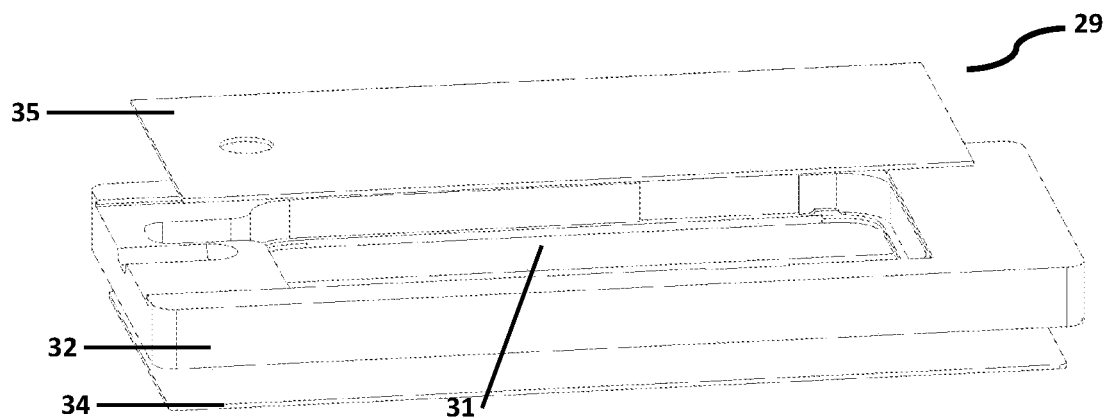
FIG. 3C is a side view of the laser mold showing the central base unit, the indentation chamber, the top slide cover, the bottom side of the central base unit with specific design with specific openings and the glass layer on the bottom side of the central base unit.
Figure 3D:
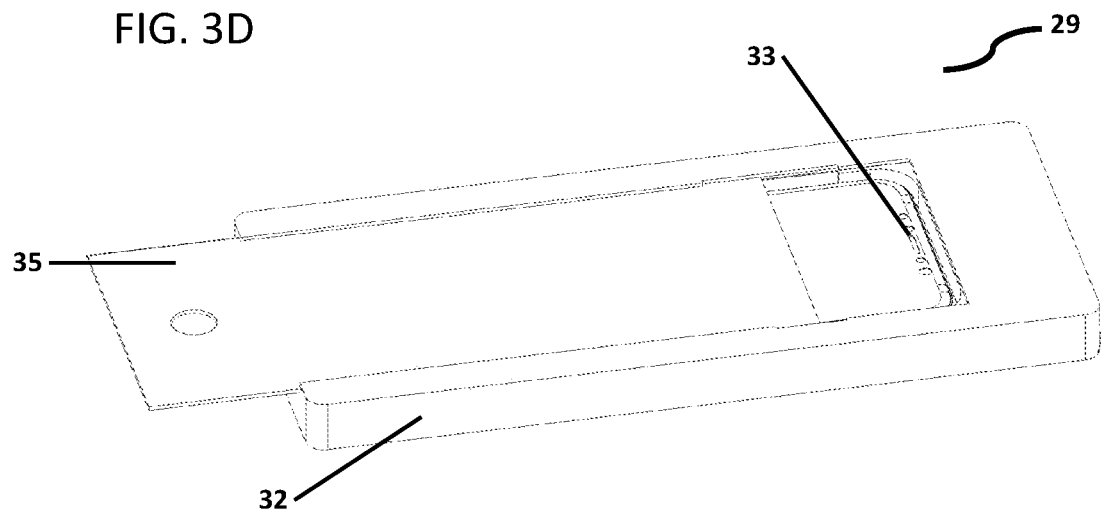
FIG. 3D is a top side view of the laser mold showing the central base unit, the indentation chamber, the top slide cover which has been slid into the central base unit, as well as an electronic mobile device which fits into the indentation chamber.
Figure 3E:
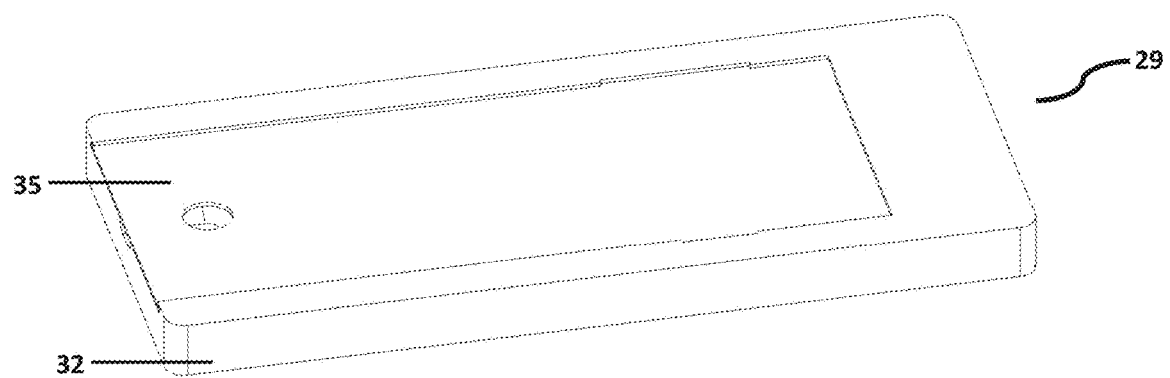
FIG. 3E is a top side view of the laser mold showing the central base unit, the top slide cover which has been slid all the way into the central base unit so as to create an airtight enclosure containing an electronic mobile device.
Figure 3F:
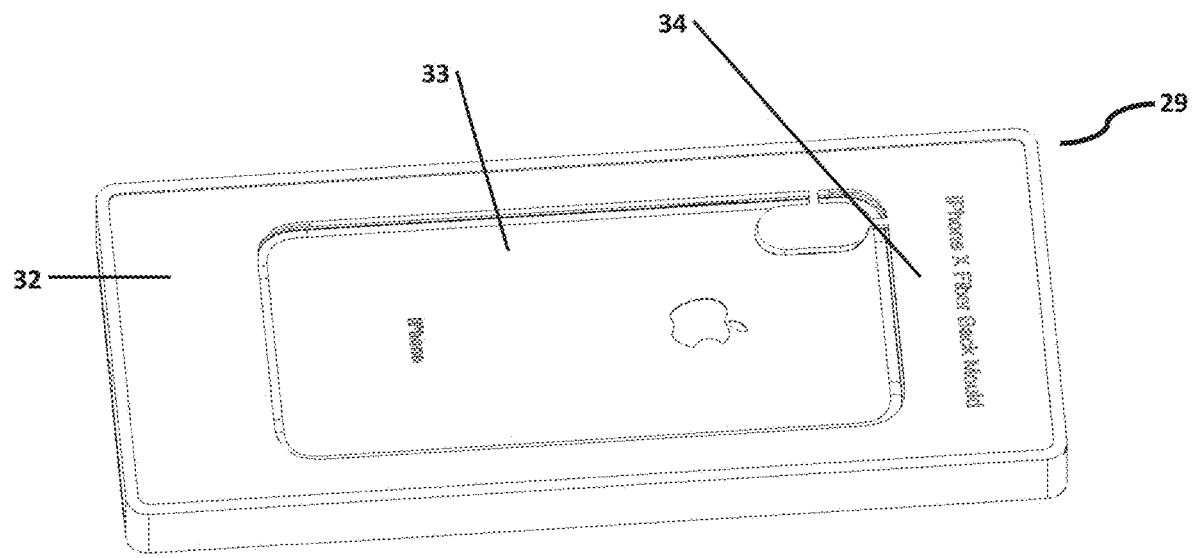
FIG. 3F is an underside view of the laser mold showing the central base unit, the underside of the indentation chamber, the bottom side of the central base unit with specific design with specific openings, the glass layer on the bottom side of the central base unit as well as an electronic mobile device which fits flush into the indentation chamber.

Turning now to FIGS. 3A through 3F various views of a laser mold 29 in accordance with one or more aspects of the present technology are shown. The mold 29 is designed to conform with the dimensions of various models of electronic mobile devices and/or mobile device screen protector sheets. The mold central base unit 32 and the indentation chamber 31 are shown. The indentation chamber 31 is used for the placement of an electronic mobile device 33 or mobile device screen protector sheet (glass or plastic) inside the indentation chamber 31 as shown in FIGS. 3D and 3F. People having skill in the art will realize that the indentation chamber 31 dimensions may vary depending on the electronic mobile device 33 and/or mobile device screen protector sheet that the mold 29 is designed for, however the mold central base unit 32 external dimensions does not change. The bottom side of the mold central base unit 32 has a specific design with specific openings as shown in FIG. 3F whereby the laser beam emanating from the laser 7 and directed by the mirror galvanometer 14 passing through the safety chamber enclosure 8, through the internal fitted glass sheet 10 and onto the bottom end of the mold 29 can only burn and/or cut the surface of the item housed within the laser mold (29) which is exposed to the laser beam (electronic mobile device 33 or mobile device screen protector sheet or any other item that the user of the central laser machine 17 wishes to burn or cut). People having skill in the art will realize that the design and specific openings of the bottom side of the mold central base unit 32 may vary. Furthermore people having skill in the art will realize that both the front glass, adhesive, back glass and underlying casing of the electronic mobile device 33 can be burnt and/or cut by the laser depending on which side of the electronic mobile device 33 is placed in the mold 29 facing the laser beams. A glass layer 34 is also shown. The glass layer 34 is used to seal and encapsulate the bottom end of the mold 29 but also to allow the laser beams emanating from the laser 7 and directed by the mirror galvanometer 14 to pass through the glass layer 34 and burn the exposed areas of the item housed within the laser mold 29. A top sliding cover 35 is also shown. The top sliding cover 35 is used to seal off the indentation chamber 31 thus ensuring that toxic fumes which are created when the laser beam burns the outer glass, adhesive and underlying casing of the electronic mobile device 33 housed in the mold 29 are trapped and allowed to settle into dust prior to the electronic mobile device 33 being removed from the indentation chamber 31 thus preventing the toxic fume poisoning of people who are located nearby. People having skill in the art will realize that the top sliding cover 35 can also be a magnetic top cover or a cover with a hinge or any other mechanism allowing the cover to seal the indentation chamber 31.

Figure 4A:
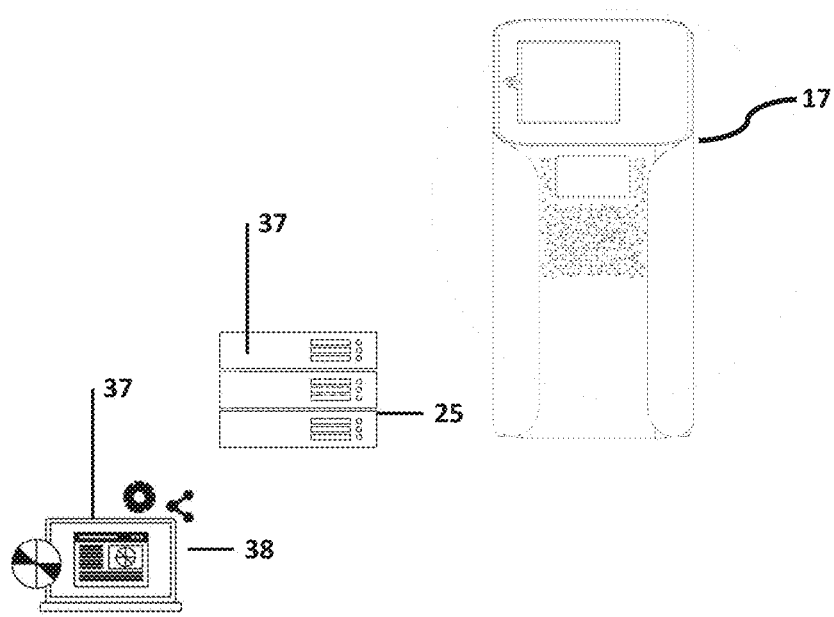
FIG. 4A is a graphical depiction showing the connection of the central laser machine and the central computer server via the Internet.

Turning now to FIG. 4A a view of the connection and communication between the central laser machine 17, the central computer server 25 which hosts a web-centric and/or mobile app based software application, and the central laser machine users computer 38 in accordance with one or more aspects of the present technology are shown. The central computer server 25 is shown. The central computer server 25 connects to the control PCB 21 via the communications PCB 26 using a two-way data Internet connection. The central computer server 25 communicates via two way Internet data communication with the control PCB 21 and utilizing a user friendly web-centric and/or mobile app software application 37 hosted on the central computer server 25 and operated by the technician/owner on the central laser machine users computer 38 is used to control all functions of the central laser machine 17. A web-centric and/or mobile app software application 37 is also shown. The web-centric and/or mobile app software application 37 is hosted on the central computer server 25 and is operated by the technician/owner on the central laser machine user's computer 38 and is used to generate real time function and operation commands for the central laser machine 17 specific to the mobile device model being repaired and/or to the mobile device screen protector sheet being cut. The web-centric and/or mobile app software application 37 also sends real time laser burning, cutting, dimensions, time and operating instructions to the central laser machine 17 specific to the mobile device model being repaired or the mobile device screen protector being cut, remotely updates the central laser machine 17 software and settings via the Internet, provides real time and historical central laser machine 17 operating data to the user of the system and also empowers the owner of one or multiple central laser machines 17 to remotely update one or more central laser machine 17 software and settings and/or remotely control the operation of one or more central laser machines 17 and/or remotely activate and de-activate one or more central laser machines 17 and/or have immediate remote access to real time or historical statistical information related to the repairs done by such machines, repairs per electronic mobile device model, repairs per technician, repairs per time period, repairs per location, repairs per grouped electronic mobile device models, technicians, time periods and locations, repair success rates, repair times, electronic mobile device models repaired, technician identity, defects of the central laser machine 17, wrong central laser machine 17 settings, user identified central laser machine 17 defects, consumables and parts required and being able to order such consumables and parts immediately on line via the web-centric and/or a mobile app software application.

Reference has been made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

The invention claimed is:

1. A system for separating a front and/or back outer glass layer from a casing/body of an electronic mobile device and for cutting a mobile device screen protector sheet by way of laser burning and cutting, comprising:
    a housing, said housing containing:
        a laser, for generating a laser beam;
        a mirror galvanometer, for directing the laser beam produced by the laser;
        a safety chamber enclosure through which the laser beam produced by the laser and directed by the mirror galvanometer is channeled for safety purposes;
        a metal plate with internal glass sheet for closing off the safety chamber enclosure and for allowing the laser beam to pass through the glass sheet;
        a chamber with opening and closing lid fitted on top of the metal plate with internal glass sheet in which the electronic mobile device or part thereof or the mobile device screen protector sheet is placed;
        a button for opening the lid;
        a control printed circuit board with processor capable of controlling operation of the laser and the mirror galvanometer;
        a power inlet utilized to provide power to the control printed circuit board and to an internal power supply of the laser;
        the internal power supply for providing power to the laser; and
        an on/off switch for powering the system on and off and also for operating the system.

2. The system of claim 1, further comprising a LCD/OLED (Liquid Crystal Display/Organic Light-Emitting Diode) display panel for displaying information regarding operation of the system and for operating the system.

3. The system of claim 1, further comprising an Ethernet input port, a Wi-Fi aerial, a WPS (Wi-Fi Protected Setup) switch and a communications printed circuit board with processor and operating system software for connecting the system via two-way data Internet connection to a central computer server so that the system can be operated via the central computer server.

4. The system of claim 3, further comprising a central computer server hosting and operating a web-centric and/or mobile app software application for allowing a user of the system to remotely operate the system via the Internet, to remotely update the system software and settings via the Internet and also to obtain real time and historical system operation data.

5. The system of claim 1, further comprising a heat sink with air fans for laser cooling purposes.

6. The system of claim 1, further comprising a height adjustable base within the chamber for adjusting a focal point of the laser beam.

7. The system of claim 1, further comprising a communications port installed on the housing for on-site system software upgrading and system diagnosis.

8. The system of claim 1, further comprising a central laser machine button installed on the housing for performing various defined machine functions.

9. The system of claim 1, further comprising laser molds configured to house the electronic mobile device being repaired or the mobile device screen protector sheet to be cut and configured to expose only parts of the electronic mobile device or the mobile device screen protector sheet to the laser beam generated by the laser and directed by the mirror galvanometer.

10. The system of claim 1, further comprising a sensor mounted on a base of the lid which ensures that the laser cannot operate unless the lid is closed.

11. The system of claim 10, further comprising a LCD/OLED display panel for displaying information regarding operation of the system and for operating the system.

12. The system of claim 11, further comprising an Ethernet input port, a Wi-Fi aerial, a WPS switch and a communications printed circuit board with processor and operating system software for connecting the system via two-way data Internet connection to a central computer server so that the system can be operated via the central computer server.

13. The system of claim 12, further comprising a central computer server hosting and operating a web-centric and/or mobile app software application for allowing a user of the system to remotely operate the system via the Internet, to remotely update the system software and settings via the Internet and also to obtain real time and historical system operation data.

14. The system of claim 13, further comprising a heat sink with air fans for laser cooling purposes.

15. The system of claim 14, further comprising a height adjustable base within the chamber for adjusting a focal point of the laser beam.

16. The system of claim 15, further comprising a communications port installed on the housing for on-site system software upgrading and system diagnosis.

17. The system of claim 16, further comprising a central laser machine button installed on the housing for performing various defined machine functions.

18. The system of claim 17, further comprising laser molds configured to house the electronic mobile device being repaired or the mobile device screen protector sheet to be cut and configured to expose only parts of the electronic mobile device or the mobile device screen protector sheet to the laser beam generated by the laser and directed by the mirror galvanometer.

* * * * *